United States Patent
Begolli et al.

(10) Patent No.: US 10,107,303 B2
(45) Date of Patent: Oct. 23, 2018

(54) FLUID COOLED SERVER AND RADIATOR

(71) Applicant: Teza Technologies LLC, Chicago, IL (US)

(72) Inventors: Vegim Begolli, Chicago, IL (US); Wilbert Yuque, Quezon (PH)

(73) Assignee: Teza Technologies LLC, Chicago, IL (US)

( * ) Notice: Subject to any disclaimer, the term of this patent is extended or adjusted under 35 U.S.C. 154(b) by 0 days.

(21) Appl. No.: 15/161,948

(22) Filed: May 23, 2016

(65) Prior Publication Data

US 2016/0345469 A1 Nov. 24, 2016

Related U.S. Application Data

(60) Provisional application No. 62/165,491, filed on May 22, 2015.

(51) Int. Cl.
*F04D 29/38* (2006.01)
*F04D 17/16* (2006.01)
(Continued)

(52) U.S. Cl.
CPC ........... *F04D 29/388* (2013.01); *F04D 17/16* (2013.01); *F04D 19/002* (2013.01);
(Continued)

(58) Field of Classification Search
CPC ............ H05K 7/20772; H05K 7/20263; F04D 29/388; F04D 17/16; F04D 19/002; F04D 29/281; G06F 1/20
(Continued)

(56) References Cited

U.S. PATENT DOCUMENTS 4,750,552 A * 6/1988 Lanquist ............ H05K 7/20745
165/104.33
5,409,055 A * 4/1995 Tanaka ................ F28D 15/0233
165/104.26
(Continued)

FOREIGN PATENT DOCUMENTS

EP 2706568 A2 3/2014
JP 2005038112 A 2/2005

OTHER PUBLICATIONS

Aug. 4, 2016 (WO) International Search Report—App PCT/US2016/033790.

*Primary Examiner* — Dion R Ferguson
*Assistant Examiner* — Amir Jalali
(74) *Attorney, Agent, or Firm* — Banner & Witcoff, Ltd.

(57) ABSTRACT

A fluid cooled server may include a reservoir for a cooling fluid, a pump for circulating the cooling fluid between components within the server, one or more tubes for transporting the cooling fluid to a water block adjacent to a component to remove heat from the component. The cooling fluid may be transported from an outlet of the water block to an inlet of a radiator for progressively removing heat from the cooling fluid. The fluid may then be transported from an outlet of the radiator to an inlet of the reservoir. In some instances, the radiator may be sized to be included within a 1U server chassis and may include two or more cooling channels and may be dimensioned such that the radiator may have a heat exchange capacity of between about 300W to about 550W. A fan module may be sized to blow air through the radiator and/or the server chassis.

21 Claims, 7 Drawing Sheets

(51) Int. Cl.
    *F04D 19/00*     (2006.01)
    *F04D 29/28*     (2006.01)
    *G06F 1/20*     (2006.01)
    *H05K 7/20*     (2006.01)

(52) U.S. Cl.
    CPC ............. *F04D 29/281* (2013.01); *G06F 1/20* (2013.01); *H05K 7/20263* (2013.01); *H05K 7/20772* (2013.01)

(58) Field of Classification Search
    USPC ........................... 361/679.53, 699, 701–703; 165/80.4–80.5, 104.33
    See application file for complete search history.

(56) References Cited

U.S. PATENT DOCUMENTS

| | | | | |
|---|---|---|---|---|
| 5,477,409 A * | 12/1995 | Sayka | ...................... | H01L 23/34 257/E23.08 |
| 6,166,907 A * | 12/2000 | Chien | ................... | F28D 1/0478 165/104.33 |
| 6,345,665 B1 * | 2/2002 | Schulz-Harder | ...... | H01L 23/467 165/80.3 |
| 6,587,335 B1 * | 7/2003 | Nelson | ...................... | G06F 1/20 165/80.3 |
| 6,826,456 B1 * | 11/2004 | Irving | ...................... | G06F 1/20 361/695 |
| 7,333,332 B2 * | 2/2008 | Wang | .................... | H01L 23/427 165/121 |
| 8,564,951 B1 * | 10/2013 | Watanabe | .......... | H05K 7/20736 165/104.33 |
| 2005/0077028 A1 * | 4/2005 | Oikawa | ................... | F28D 15/02 165/80.4 |
| 2005/0243520 A1 * | 11/2005 | Tomioka | ............. | F04D 29/5866 361/702 |
| 2006/0219388 A1 * | 10/2006 | Terakado | ................ | G06F 1/203 165/80.4 |
| 2010/0032142 A1 * | 2/2010 | Copeland | ............ | G05D 23/1925 165/104.33 |
| 2012/0241137 A1 | 9/2012 | Aoki et al. | | |
| 2013/0108461 A1 * | 5/2013 | Yoshida | ................ | F04D 29/329 416/241 R |
| 2014/0078668 A1 * | 3/2014 | Goulden | ............ | H05K 7/20736 361/679.47 |
| 2016/0262288 A1 * | 9/2016 | Chainer | ............. | H05K 7/20336 |

* cited by examiner

FLUID COOLED SERVER AND RADIATOR

This application claims the benefit of, and priority to, U.S. Provisional Patent Application Ser. No. 62/165,491 filed May 22, 2015. The contents of the above-identified application are expressly incorporated herein by reference in its entirety for any and all non-limiting purposes.

BACKGROUND

Aspects of the disclosure relate to computer hardware. In particular, one or more aspects of the disclosure generally relate to computer hardware for cooling a computer server.

Many organizations and businesses utilize multiple computing devices, such as computer servers and the like, as part of their business. In many cases, the servers may generally be arranged in such a way as to minimize the space and/or area that the servers occupy (e.g., servers may be stacked on racks in a server cabinet). During operation, servers generally produce heat, which may have a negative effect on their performance. Further, because multiple servers are arranged close to one another so as to minimize the amount of space they occupy, there is a corresponding increase in the amount of heat that surrounds each server. In many cases, operation of a computing device may degrade as the temperature of its internal components (e.g., central processing unit, memory devices, communication controllers, etc.) increase. This increase in heat may cause the servers to become unstable.

The demand for servers that are able to perform in an effective and fast manner, while existing in a high power and high heat density server computer environment, has increased. This increased demand results in the need for improved methods for cooling servers. Generally, the performance, size and scalability of a cooling solution are critical aspects when implementing an improved cooling method. In many cases, a cooling air conditioning system is utilized to cool a room in which computing equipment is installed to dissipate the heat generated by the computing equipment. However, many businesses are increasing the number of servers and/or are running their computing equipment at higher clock speeds (e.g., overclocking), thus increasing the need for a more efficient means for cooling the servers. In many cases, the increased heat generated from a greater number of computing devices installed in an organization's server room and/or use of overclocked computer servers may produce enough heat such that the organization may need to upgrade the cooling capacity of the cooling system serving the server room. As such, a need has been recognized for cooling individual servers (e.g., high density servers, overclocked servers, standard servers, etc.) such that heat generated by the individual servers can be managed while minimizing the physical space requirements of the computer servers and associated equipment and staying within the cooling capacity of the server room cooling system.

SUMMARY

Aspects of the disclosure provide effective, efficient, and convenient ways of cooling a server. In particular, certain aspects of the disclosure identify a cooling system for a server.

In particular, some aspects of the disclosure identify a multi-pass radiator in use for progressive cooling of computing equipment, such as a computer server. The radiator may include an inlet, an outlet, a reservoir, and a plurality of connected fluid channels (e.g., four fluid channels, six fluid channels, etc.). In some aspects, the radiator may be sized to fit in a standard chassis configuration. For example, the radiator may have a height associated with a standard form factor (e.g., a 1U form factor), such as a height of less than or equal to 40 mm, less than or equal to 44 mm, etc. The radiator may be secured within a computer server having the 1U form factor chassis. In some instances, the radiator may provide at least 350 W of heat exchange capacity, or in other instances at least 350 W up to about 500 W heat exchange capacity.

In certain aspects, the radiator for the computer server may include a fan module. In some aspects, the fan module may include a plurality of fans (e.g., three fans, six fans, nine fans, etc.) and in some instances at least a portion of the fans may be reinforced. In certain instances, the plurality of fans included in the fan module may be configured as high power pans for blowing a high volume of air through the chassis of the computer server. In some instances, the airflow provided by the fan module may be at least 200 CFM.

Other aspects of the disclosure identify an illustrative cooling system for use in cooling computing equipment, such as a computer server. The cooling system may include at least a reservoir, radiator, a fan module, a pump, a water block, and tubing to facilitate fluid flow between various components of the cooling system. In some instances, the radiator may include two or more fluid channels (e.g., four fluid channels, five fluid channels, six fluid channels, etc.). In some cases, the fan module may include one or more fans to provide air flow through the radiator to facilitate the transfer of heat out of the coolant flowing in the radiator. In some cases, the one or more fans in the fan module may be reinforced. In some cases, the water block may be a low profile water block to fit within a standard computing device form factor (e.g., a 1U chassis form factor, etc.). For example, the water block may have a height of less than or equal to 23 mm. The water block may be attached (e.g., by rivets, nails, bolts, screws, adhesive, and the like) to a central processing unit (CPU) to ensure that the CPU remains within a rated temperature range. In some instances, the cooling system may cool at least a portion of the computer server (e.g., the CPU, etc.) to an average core temperature within a predefined range (e.g., about 60° C. to about 70° C.). In some cases, the fan module may provide airflow through the computer server at a predefined rate (e.g., at least 140 CFM, about 200 CFM, etc.). In some cases, cooling system may expel air from the computer server at a predefined air velocity rate, such as an air velocity of at least 4 m/sec.

Various aspects of the disclosure identify a computer server including a radiator attached to a fan module, wherein the radiator and fan module may be positioned at an exterior portion (e.g., a front area, a rear area, etc.) of a computer server chassis, at least one first fluid tube extending from the radiator to a pump, wherein the pump is positioned at a central area of the computer server chassis, at least one second fluid tube extending from the pump to a water block, wherein the water block is attached to a central processing unit at a rear area of the computer server chassis, a motherboard positioned at the rear area of the computer server chassis, a power supply unit positioned at the rear area of the computer server chassis, and at least one hard drive positioned at the central area of the computer server chassis. In some cases, a coolant reservoir may be located external to one or more computer servers and connected to an inlet and/or an outlet of the radiator via tubing (e.g., flexible tubing, rigid tubing, a combination of flexible tubing and rigid tubing, etc.).

These features, along with many others, are discussed in greater detail below.

BRIEF DESCRIPTION OF THE DRAWINGS

The present disclosure is illustrated by way of example and not limited in the accompanying figures in which like reference numerals indicate similar elements and in which.

DETAILED DESCRIPTION

In the following description of various illustrative embodiments, reference is made to the accompanying drawings, which form a part hereof, and in which is shown, by way of illustration, various embodiments in which aspects of the disclosure may be practiced. It is to be understood that other embodiments may be utilized, and structural and functional modifications may be made, without departing from the scope of the present disclosure.

Figure 1:
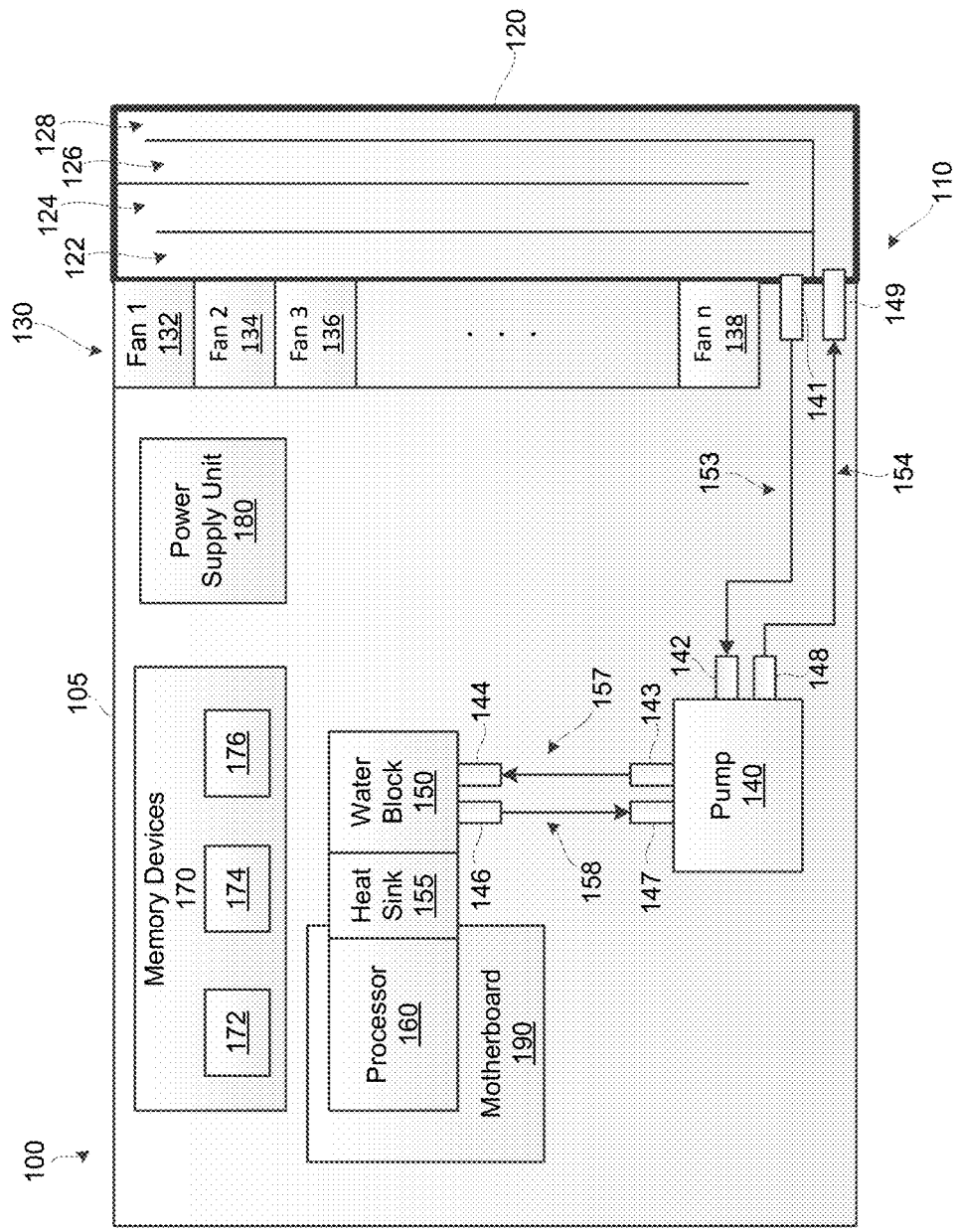
FIG. 1 illustrates an example of a computer server according to one or more embodiments.

FIG. 1 illustrates an example of a computer server 100 according to one or more embodiments. In some embodiments, computer server 100 includes a number of different components. For example, a computer server may include at least an enclosure 105 (e.g., a box, a chassis, etc.), a cooling system 110 (which may include, e.g., a radiator 120 comprising four or more connected fluid channels (e.g., fluid channel 122, fluid channel 124, fluid channel 126, fluid channel 128, etc.), a fan module 130 including one or more fans (e.g., fan 132, fan 134, fan 136, fan 138, etc.), a pump 140, a water block 150, flexible and/or rigid tubing (e.g., tubing 153, tubing 157, etc.) and the like), one or more memory devices 170 such as a hard drive 172, random access memory (RAM) 174, read-only memory (ROM) 176, flash memory, and/or the like, a power supply unit (PSU) 180, at least one processor 160 (e.g., a central processing unit (CPU), a microcontroller unit (MCU), a microprocessor unit (MCU), a graphics control unit (GPU) etc.), a motherboard 190, and other such components. In certain instances, the power supply unit 180 may be at least a 700 W power supply unit. In some aspects, computer server 100 may include at least two hard drives and/or may be communicatively coupled to one or more external memory devices (e.g., a, such as a redundant array of independent disks (RAID), etc.) via a network. In some cases, the enclosure 105 of the computer server 100 may be dimensioned according to an industry standard such as an industry standard rack mount and may be configured to fit a standardized rack format (e.g., a 19 inch rack unit, etc.) as a single rack unit (1U). In some aspects, the enclosure 105 of computer server 100 may have a height of about 1.75 inches (44.45 mm) and may have a width of about 19 inches (482.60 mm). In some cases, the width of the enclosure 105 may be about 23 inches (584.20 mm). In some cases, the enclosure of the server may be defined according to one or more industry standards, such as the Electronic Industries Alliance (EIA) EIA-310-D standard entitled "Cabinets, Racks, Panels, and Associated Equipment, dated September 1992. (Latest Standard Now REV E 1996), Consumer Electronics Association (CEA) CEA-310-E "Design requirements for Cabinets, Panels, Racks and Subracks"., dated Dec. 14, 2005, International Electrotechnical Commission (IEC) IEC-60297 "Mechanical structures for electronic equipment—Dimensions of mechanical structures of the 482.6 mm (19 in) series", and the like which are included herein by reference.

As seen in FIG. 1 the illustrative computer server 100 may include a plurality of components (such as the PSU 180, the processor 160, and the like) that may generate heat during normal operation of the server 100. The components of the computer server 100 generate heat when the computer server is in use, and in cases where the processor is overclocked, may require greater heat dissipation than when the processors are used within manufacturer-specified parameters. Overclocking may be defined configuring a computing device so that the device (e.g., the server 100) runs faster than the manufacturer-specified speed of one or more components of the device. The purpose of overclocking is to boost performance. A user may overclock a processor to improve the performance of a computing device and/or conform to the requirements of particular software application and/or to reduce the cost of a computing installation by reducing size and/or cost of the installed computing devices. In general, processors may be considered to be the most commonly overclocked computer part. Additional components, such as memory devices, motherboard chipsets, graphics cards and the like may also be overclocked. In some instances, the heat generated by the components of the computer server may have a negative effect on the effectiveness of the server (e.g., the speed that the server may operate), if the heat cannot be efficiently removed. In general, the performance of chipsets (e.g., processors, memory devices, graphics controllers, communication chipsets, etc.) may decrease as the internal temperature of the chips increases. As such, the components of the computer server may be organized in the enclosure 105 in a specific arrangement so as to minimize the amount of heat generated and/or to provide for the greatest cooling effect of airflow through the enclosure 105. In other instances, the components of the computer server may be organized in such a way as to maximize the effect of the cooling system 110 on the other components of the computer server 100.

In some instances, the radiator 120 and the fan module 130 may be located adjacent to each other at an edge (e.g., the rear edge, a side edge, a front edge, etc.) of the enclosure 105. In some cases, the radiator 120 and the fan module 130 of the cooling system 110 may be located at an area near the interior edge at the back of the enclosure 105 or near an interior edge at the front of the enclosure 105. In some cases, the processor 160 may be physically connected to a heat sink 155 to facilitate cooling of the processor, along with the attached water block 150. In some cases, the power supply unit 180 may be physically positioned away from the motherboard 190 within the enclosure 105 to encourage airflow and to minimize the effect of the heat generated by one of the components on the other. In some cases, the pump 140, along with other components (e.g., the hard drive 172, a communication interface, etc.) may be positioned at a central area of enclosure 105. In some cases, the arrangement of components within the enclosure 105 may locate the components that will generate a higher level of heat (e.g., the processor 160, the PSU 180, etc.)) at the front of the enclosure 105, while the components of the cooling system 110 (e.g., the radiator and fan module) are positioned at the rear of the enclosure 105. This arrangement allows for cooler intake air to be absorbed at the front of the chassis and warmed air to be expelled from the rear of the chassis. In certain instances, computer server 100 may be positioned in such a way that cooler air is available at the front of the chassis, while heated air is present at the rear of the chassis (e.g., computer server may be positioned in such a way that the front of the chassis faces a cold aisle and a rear of the chassis faces a hot aisle). The cooled air may be at a temperature of 10° C. to 20° C.

Figure 2:
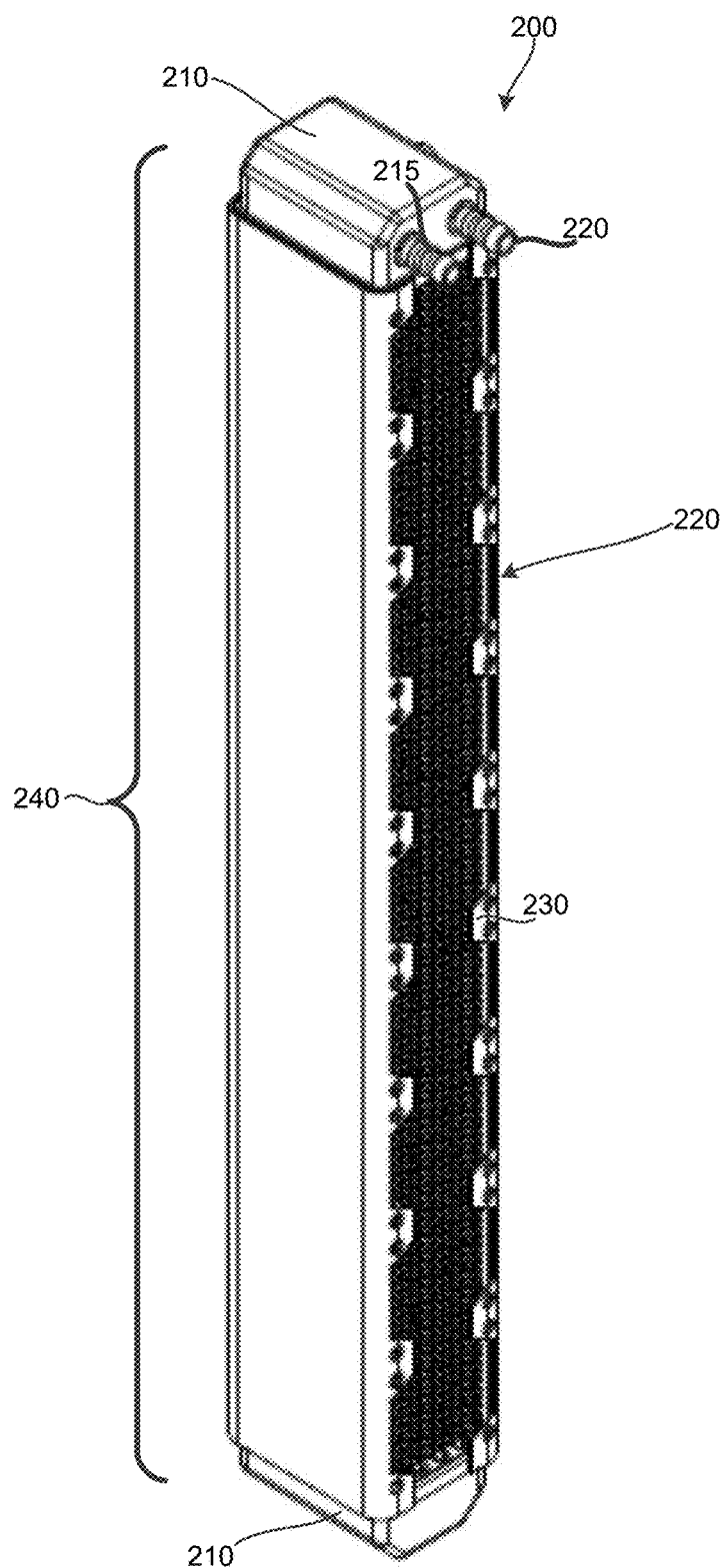
FIG. 2 illustrates an example of a radiator and fan module according to one or more embodiments.

FIG. 2 illustrates an example of a radiator 200 (e.g., the radiator 120) that may be connected to the fan module 130 according to one or more embodiments. In some cases, the radiator 200 may be implemented in one or more computer servers. Radiator 200 may be a fluid cooled radiator having an external frame 240 and fins 220 (illustrated generally as a shaded portion of the radiator 2) which may at least partially enclose a plurality of fluid channels to facilitate heat transfer from the coolant fluid. In some cases, the fluid channels 122, 124, 126, and 128, etc. may be located internal to the radiator 200 and are not seen in this view In certain instances, the radiator 200 may be secured within a 1U chassis, such that the height, width and/or depth of the radiator 200 may have dimensions small enough to fit within the enclosure 105. For example, the radiator 200 and/or the fan module 130 may each have a height of less than 44 mm and less the combined thickness of the top portion and bottom portion of the enclosure 105. In some cases, the radiator 200, 120 and/or the fan module 130 may be installed at an exterior edge of the enclosure 105.

In some cases, the radiator 200 may include a multi-pass progressive flow pattern as shown in the radiator 120 of FIG. 1. In some cases, each of the plurality of fluid channels 122, 124, 126, 128 that form the multi-pass progressive flow pattern may be generally configured as a cylindrical tube. In some instances, the radiator 200 may include a number of fluid channels to provide progressive cooling of the fluid within the cooling system 110. For example, the radiator 200 may include at least two fluid channels, four fluid channels, six fluid channels, etc. In some cases, the radiator 200 may include one or more end tanks 210. The end tanks 210 may be partitioned end tanks where a portion of the end tank is incorporated into one or more of the fluid channels. For example, the partitioned end tanks 210 may create chambers to guide the flow of a coolant fluid from a first fluid channel 122 to a second fluid channel 124 to a third fluid channel 126 and the like. In some aspects, radiator 200 may include an inlet 215 and an outlet 220. The radiator 200 may also include a reservoir (not shown) that may be physically attached to the radiator 200 at an external surface of the radiator. In some cases, the reservoir may be connected to one of the inlet 215 or the outlet 220 via a fluid channel (e.g., tubing). In some cases, the reservoir may be incorporated internal to the radiator 200, such as being incorporated into a portion of one or more fluid channels 122, 124, 126, or 128, and/or into at least a portion of the end tanks 210. In some instances, the reservoir may contain fluid for providing cooling to airflow within the radiator 200. The fluid for cooling may include water, a coolant, or a high-temperature coolant.

In some cases, a heated fluid passes through the inlet 215 of the radiator 200. The fluid may flow from the first fluid channel 122, to a second fluid channel 124, to a third fluid channel 126, to a fourth fluid channel 128, and in some cases additionally to a fifth fluid channel and to a sixth fluid channel up to and including an $n^{th}$ cooling channel of the radiator 200. Each pass of the fluid through a fluid channel results in the fluid being progressively cooled with passage through successive fluid channels (e.g., allowing extended passage time within the radiator to remove heat from the fluid). The cooled fluid may pass through the outlet 220 of the radiator 200 at a temperature lower (e.g., 5 degrees cooler, 10 degrees cooler, 15 degrees cooler, etc.) than the fluid temperature at the inlet 215. In some instances, radiator 200 may have a heat exchange capacity of at least 350W, between a range of about 350W to about 500W, less than or equal to about 500W in a 1U chassis, etc. In some cases, the radiator fins 220 may be configured to promote efficient airflow and to provide the desired heat exchange capabilities, such as by maximizing airflow over warmer portions of the radiator.

In some embodiments, a radiator assembly may include a fan module, such as the fan module 130 which may be located physically adjacent to the radiator. For example, the fan module 130, or the individual fans 132-138 included in the fan module 130, may be affixed to the radiator via a fastener (e.g., bolts, screws, an adhesive material, etc.) at a structural portion (e.g., a mounting flange 230) of the radiator 200. As discussed above, in some cases, the fan module 130 may include at least one fan 132 and may include two or more fans (e.g., two fans, three fans, four fans, eight fans, ten fans, etc.). In some cases, the one or more fans of the fan module 130 may be a high pressure (e.g., a high airflow) fan. In some cases, the one or more fans may have reinforced fan blades. For example, each fan blade (e.g., 3 blades, 4 blades, 9 blades, etc.) be reinforced to provide fan blades that are sturdier than non-reinforced fins. For example, the reinforced fan blades may have an increased durability (e.g., an increased resistance to warping while in motion) when operating at high speeds and/or air flow rates to provide increased cooling performance. In some cases, the design of the fan blades and/or other components (e.g., bearings, etc.) may be such that noise generated during operation may be minimized. In some cases, the fans may be constructed using fasteners (e.g., anti-vibration rivets, gaskets, etc.) that may be used to minimized vibration during operation.

As mentioned above, the fan module 130 may be attached to the radiator 120, 200. In some cases, the fan module 130 may be attached to the radiator 200 by one or more fastener types that may include one or more of rivets, bolts, screws, nails, adhesive (e.g., tape, Velcro®, and the like). In some cases, the fan module 130 may be positioned to pull air through the front and/or sides of the enclosure 105 over and/or by the heat generating components such air warmed by the heat producing components may be removed from the enclosure 105. In some cases, a portion of heat producing components within the computer (e.g., a processor, a memory device, a power supply, etc.) may be air cooled and at least one of the heat producing components (e.g., a CPU, etc.) may be fluid cooled. The fan module 130 may pull air through the front and/or sides of the enclosure 105 to flow through the enclosure 105 and out of the chassis through the radiator 200. In some cases, the airflow rate of the air pulled through the chassis 105 may be greater than a predetermined airflow rate (e.g., about 150 CFM, at least 200 CFM, etc.). In certain instances, the air pulled into the enclosure 105 may be ambient air of a room in which the computing device is installed. For example, the air within the server room may be cooled air having a temperature of 10° C. to 20° C. In some cases, the air flowing through the computer enclosure 105 may be provided directly to an opening at the exterior portion of the enclosure 105 via ductwork or other similar means.

Figure 3A:
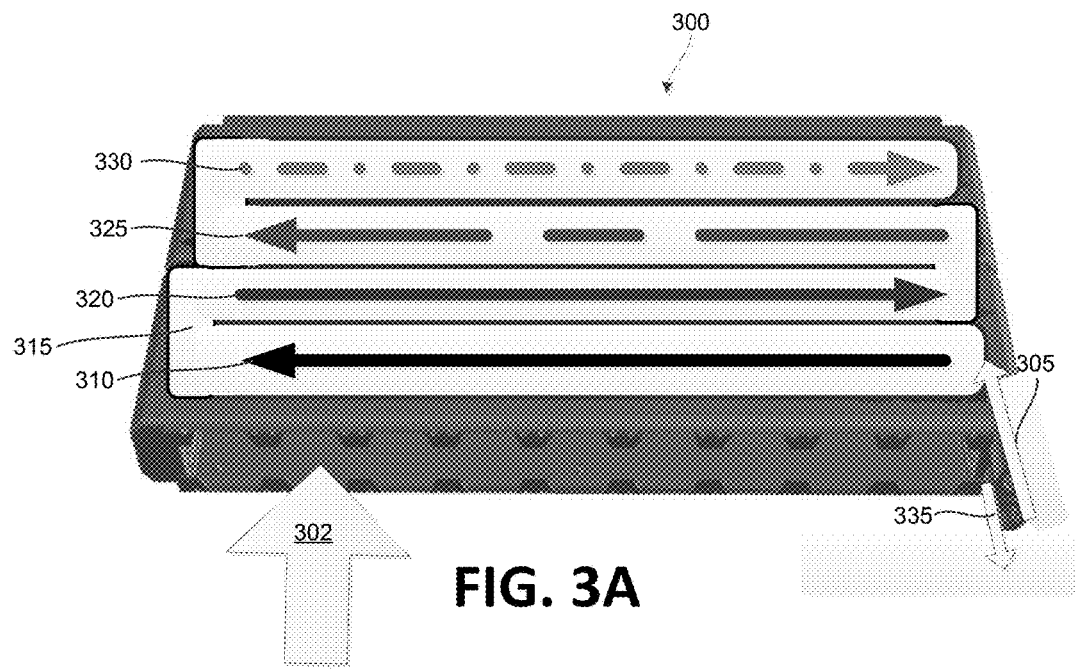
FIGS. 3A and 3B show illustrative radiators and configured for progressive cooling of coolant according to aspects of the disclosure.
Figure 3B:
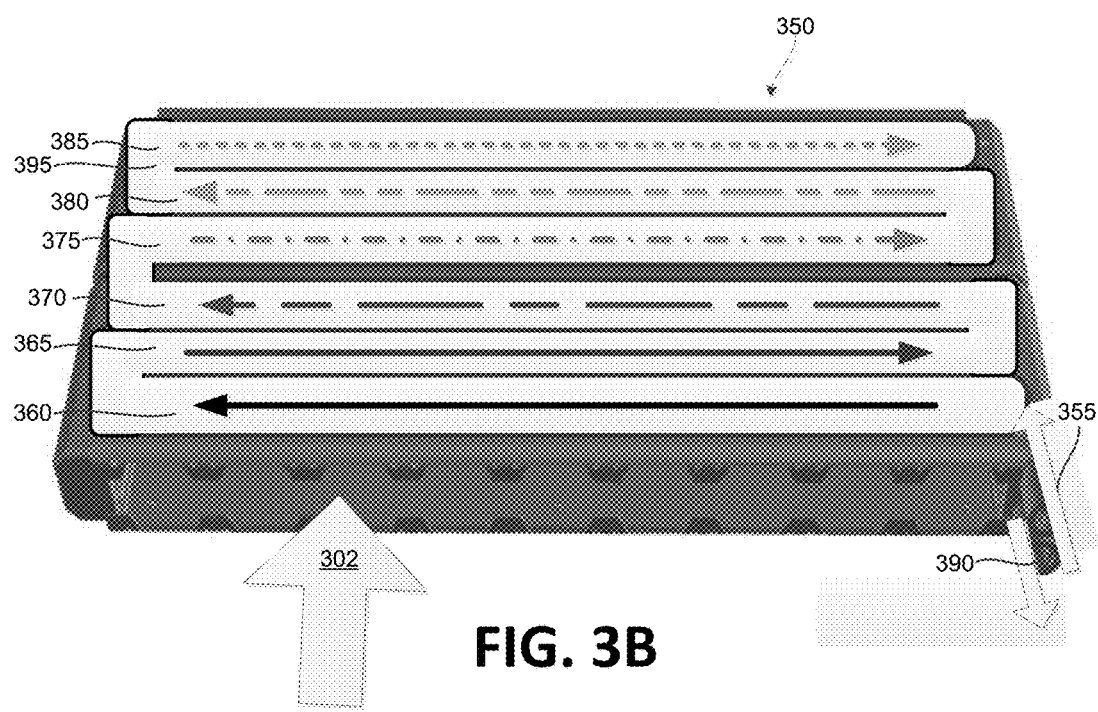

FIGS. 3A and 3B show illustrative radiators 300 and 350 configured for progressive cooling of coolant according to aspects of the disclosure. For example, the radiator 300 shows a radiator configured with an inlet 305 and an outlet 335 fluidly coupled to four cooling channels 310, 320, 325, and 330, along with a plurality of end tanks 315 having at least a portion configured as part of the fluid channel, such as to connect a first fluid channel 310 with a second fluid channel 320. Similarly, the radiator 350 includes six fluid channels 360, 365, 370, 375, 380, and 385 along with a plurality of end tanks 395 having at least a portion configured as part of the fluid channel, such as to connect a fifth fluid channel 380 with a sixth fluid channel 385. As shown in FIGS. 3A and 3B, airflow 302 from the fan module 130 may flow into an opening at the front edge of the radiator 300, 350 near the first fluid channel 310, 360 and exits the radiator 300, 350 via an opening at the back edge of the radiator 300, 350 near the fourth fluid channel 330 of the radiator 300 or near the sixth fluid channel 385 of the radiator 350. In some cases, the back edge of the radiator 300 aligns with a back edge of the computer server enclosure (e.g., enclosure 105) to allow heated air to exit the computer server. In some cases, the radiators 300 and 350 are configured for progressive cooling of a fluid flowing in the fluid channels (e.g., the fluid channels 310, 320, 325, and 330 of the radiator 300, the fluid channels 360, 365, 370, 375, 380, and 385 of the radiator 350). For example, a heated fluid (e.g., a coolant, water, etc.) may enter the radiator 300 via a fluid inlet 305 and flow through the first fluid channel 310 and may be cooled such that a temperature of the fluid exiting the first fluid channel (and entering the second fluid channel) is less than a temperature of the fluid at the inlet 305. For example, the fluid may experience progressive cooling through the radiator 300 including a first temperature drop (e.g., $\Delta T1$) along the length of the first fluid channel 310, a second temperature drop (e.g., $\Delta T2$) along the length of the second fluid channel 320, a third temperature drop (e.g., $\Delta T3$) along the length of the third fluid channel 325, and a fourth temperature drop (e.g., $\Delta T4$) along the length of the fourth fluid channel 330 before the coolant fluid exits the radiator by flowing out the outlet 335. In some cases, the cooled fluid may enter a reservoir to experience additional cooling before being pumped to a water block located at a component to be cooled. Similarly, the fluid may experience a second amount of progressive cooling through the radiator 350 having six fluid channels that is different than the amount of cooling experienced from the fluid flow through the radiator 300 having four fluid channels. For example, the progressive cooling of the radiator 350 may experience a greater amount of cooling than may be provided by the radiator 300 and may include a first temperature drop (e.g., $\Delta T1$=about 1 degree, about 2 degrees, about 3 degrees, about 5 degrees, about 10 degrees, etc.) along the length of the first fluid channel 360 entering via the inlet 355, a second temperature drop (e.g., $\Delta T2$) along the length of the second fluid channel 365, a third temperature drop (e.g., $\Delta T3$=about 1 degree, about 2 degrees, about 3 degrees, about 5 degrees, about 10 degrees, etc.) along the length of the third fluid channel 370, a fourth temperature drop (e.g., $\Delta T4$=about 1 degree, about 2 degrees, about 3 degrees, about 5 degrees, about 10 degrees, etc.) along the length of the fourth fluid channel 375, a fifth temperature drop (e.g., $\Delta T5$=about 1 degree, about 2 degrees, about 3 degrees, about 5 degrees, about 10 degrees, etc.) along the length of the fifth fluid channel 380, and a sixth temperature drop (e.g., $\Delta T6$=about 1 degree, about 2 degrees, about 3 degrees, about 5 degrees, about 10 degrees, etc.) along the length of the sixth fluid channel 385 before the coolant fluid exits the radiator by flowing out the outlet 390.

Figure 4:
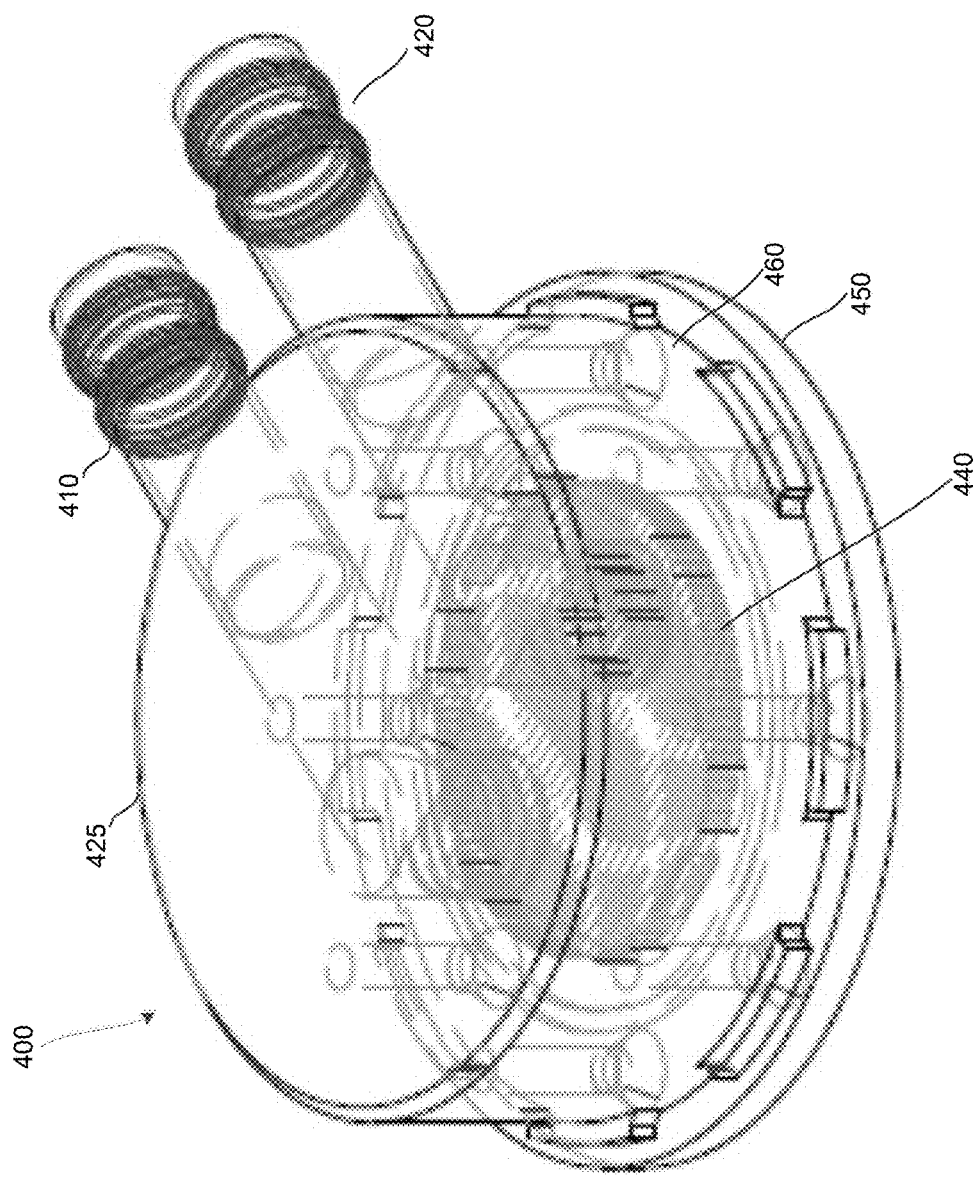
FIG. 4 illustrates an example of a water block according to one or more embodiments.

FIG. 4 illustrates an example of a water block 400 according to one or more embodiments. In some cases, the water block 400 may be implemented in one or more computer servers. The water block 400 may be mounted to a heat producing component, such as a processor (e.g., a central processing unit, a power supply, etc.). In some cases, the water block 400 may be configured for cool or cold fluid to enter the water block 400 via a fluid inlet 410. The fluid may flow in an interior portion of the water block 400, such as through a heat sink 440, where the heat sink 440 may be configured to be located over a heat producing component, such as the processor 160 of FIG. 1. In some cases, the water block 400 may be mounted at a bottom surface 450 to the central processing unit by bolts, rivets, screws, adhesive (which may include, e.g., tape, Velcro®, etc.), and the like. In some cases, the heat sink 440 may be integrated into to the water block 400. In some cases, the heat sink 440 may be affixed to the CPU, where the water block 400 may be affixed to the heat sink. The water block 400 may provide a cooling effect on the central processing unit when fluid is circulated throughout water block 400. At least one fluid tube may be connected to inlet 410 and at least one fluid tube may be connected to the outlet 420 to facilitate water flow into and out of the water block as part of the fluid flow throughout the computer cooling system. In some cases, the water block 400 may include a gasket to provide a fluid-proof seal between a top portion of the water block enclosure 425 and a bottom portion of the water block enclosure 425.

The water block 400 may be a low profile water block. In some aspects, the water block 400 may have a height of less than or equal to 30 mm, a height of between about 20 to about 30 mm, or, in some instances, of at least about 23 mm, when mounted to the central processing unit. In some instances, the water block 400 may be configured to process a high flow rate of fluid as provided by a pump fluidly connected to the water block 400 (e.g., fluid is passed through the water block 400 at an increased rate). In some cases, the water block 400 may be manufactured of copper, aluminum, plastic, and/or another durable material. For example, it is generally understood that a water block 400 manufactured of copper may be durable, while still being hollow. The water block 400 manufactured of copper is generally more durable than water blocks manufactured from aluminum or other cheaper metals. A copper water block may be more durable and therefore better able to withstand a high flow rate of fluid.

Returning to FIG. 1 which shows an illustrative cooling system 110 according to one or more embodiments. In some cases, the cooling system 100 may include at least a radiator 120, a fan module 130, a water block 150, a pump 140, a first fluid tube, a second fluid tube, a third fluid tube, and a fourth fluid tube, a fluid reservoir, a coolant fluid, and the like. In some cases, the radiator 120 may be physically adjacent to the fan module 130. In some cases, the radiator 120 may be attached to fan module 130. In some cases, at least one first fluid tube 153 may extend from an outlet 141 of the radiator 120 to an inlet 142 of the pump 140, a second fluid tube 157 may extend from an outlet 143 of the pump 140 to an inlet 144 of the water block 160, a third fluid tube 158 may extend from an outlet 146 of the water block 150 to an inlet 147 of the pump 140, and a fourth fluid tube 154 may extend from an outlet 148 of the pump 140 to an inlet 149 of the radiator 120 forming a closed fluid path including the plurality of fluid channels of the radiator 120. Fluid, which may include water, coolant, high temperature coolant, and the like, may flow (e.g., be pumped, etc.) from radiator 120 to the water block 160 and back from the water block 150 to the radiator 120 through the various tubes 153, 154, 157, 158 and the pump 140.

In some cases, the operation of the cooling system 110 may result in a computer server with an average core temperature of between about 50° C. to about 80° C., of about 60° C. to about 70° C., or in some instances about 65° C. The operation of cooling system 110 (e.g., the fan module 130) may provide airflow through the core of the computer server of at least 140 CFM, or in some instances about 149 CFM. In some aspects, the operation of cooling system 400 expels air from the core of the computer server at an air velocity rate of at least 4 m/sec, or in some instances at a rate of 4.2 m/sec.

As indicated above, these are examples of the components and/or other elements that may be included in computer server 100 in some embodiments, as well as some of the functions that may be performed. In other embodiments, additional and/or alternative components and/or other elements may similarly be included and/or other functions may be performed, in addition to and/or instead of those discussed above.

Having described an example cooling system that may be used in cooling a computer server 100 in some embodiments, an example of a method that may, in some embodiments, be performed (e.g., by such a cooling system) will now be discussed in greater detail with respect to FIG. 5.

Figure 5:
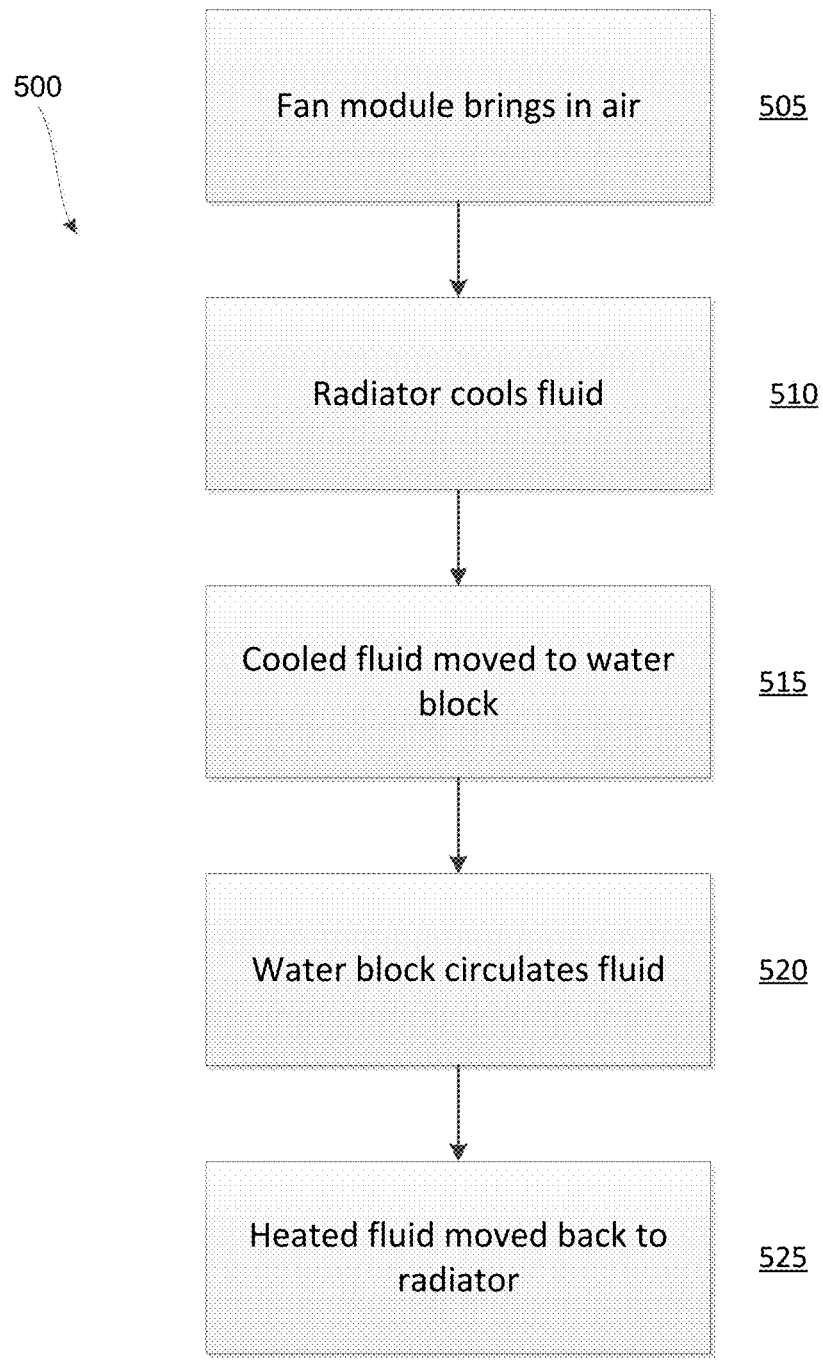
FIG. 5 illustrates an example of a cooling system according to one or more embodiments.

FIG. 5 illustrates a flowchart 500 that shows a method of cooling a computer server 100 according to one or more aspects of the disclosure. In some cases, the illustrative method 500 illustrated in FIG. 5 may be performed by a computer server, which may include and/or implement one or more aspects of cooling system 110.

As seen in FIG. 5, the method may be initiated in step 505, in which air is brought into a chassis of computer server 100. For example, in step 505, a fan module may transport air through the chassis via an opening on the front, one or more openings on the sides, and the like. In some aspects, the air is cooled air (e.g., externally cooled air). The air may have a temperature of 10° C. to 20° C. The cooled air may be circulated around one or more components generating heat before being used to cool the fluid flowing within the radiator 120. In some instances, the cooled air may additionally be circulated throughout an interior space within the enclosure 105 of the computer server 110.

In step 510, the radiator 120 may cool a fluid. For example, in step 510, the radiator 110, which may be cooled via an externally applied airflow in, may pass fluid through multiple channels (e.g., at least four cooling channels, at least six cooling channels, etc.) to cool the fluid. In some instances, the fluid is water, coolant, or a high temperature coolant. In certain aspects, the fluid passes through an inlet of the radiator and proceeds to flow through two or more multiple fluid channels, before passing through an outlet. In some instances, the fluid passes through two fluid channels, four fluid channels, five fluid channels, six fluid channels, etc. Each pass of the fluid through a single fluid channel serves to cool the fluid to a lower temperature.

In step 515, the cooled fluid may be passed (e.g., pumped) to a water block. For example, in step 515, a pump may transport the cooled fluid from the radiator to a water block via at least one fluid tube. In some instances, the cooled fluid is transported from the outlet of the radiator 120 to a water block 150. The cooled fluid may be transported by a pump from the radiator to the water block. In some instances, a first fluid tube may transport the cooled fluid to the pump and a second fluid tube may then transport the cooled fluid from the pump to the water block.

In step 520, the water block may circulate the cooled fluid near a computing component to be cooled. For example, in step 520, the cooled fluid may be circulated through the water block attached to a central processing unit. In some instances, cooled fluid is passed through an inlet of the water block and circulated within the water block before passing out an outlet. The circulation of cooled fluid through the water block results in the cooling of the central processing unit. A result of the circulation of the cooled fluid through the water block is that the fluid passing out of the outlet of the water block may have been heated by the computing component.

In step 525, the heated fluid is passed back to the radiator. For example, in step 525, the pump may transport the heated fluid from the water block to the radiator via at least one fluid tube. In some instances, the heated fluid is transported from the outlet of the water block to the radiator. The heated fluid may be transported by the pump from the water block to the radiator. In some instances, a third fluid tube may transport the heated fluid to the pump and a fourth fluid tube may then transport the heated fluid from the pump to the radiator. The heated fluid may then be passed into a reservoir of the radiator. In some instances, the cooled fluid may be transported from the outlet of the radiator to a reservoir. The pump may then be positioned so that the pump transports the cooled fluid from the reservoir to the inlet of the water block. The fluid may then exit the outlet of the water block and to be transported to the inlet of the radiator.

Subsequently, the method may end. As illustrated in the examples above, however, certain aspects of the cooling of the computer server may be repeated (e.g., fluid may be cooled and heated repeatedly as it passes from the radiator to the water block and back to the radiator).

Figure 6:
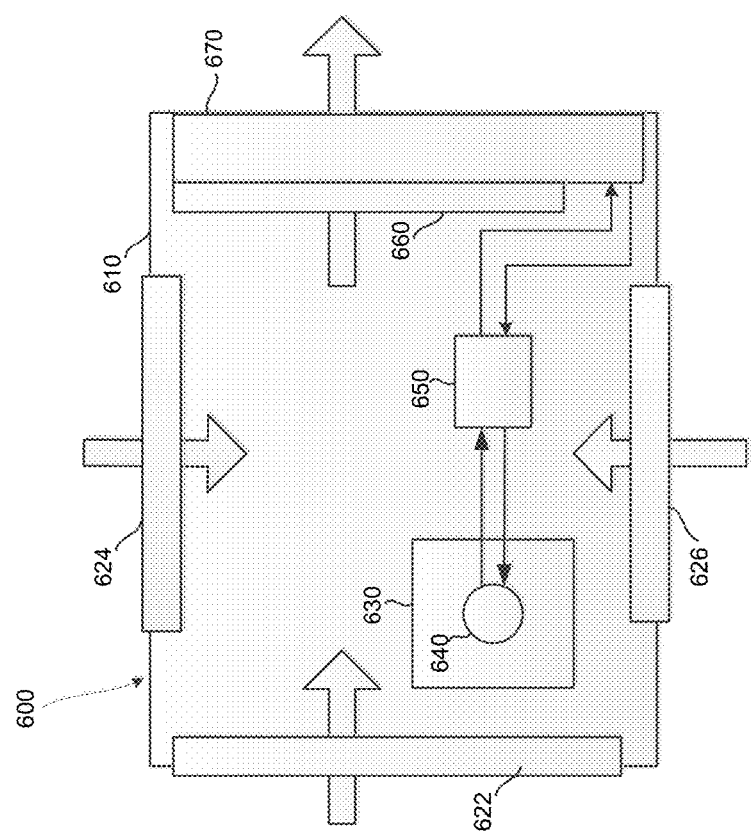
FIG. 6 illustrates a flowchart that depicts a method of cooling a server according to one or more embodiments.

FIG. 6 shows an illustrative airflow pattern 600 associated with a fluid cooled server 610. In some cases, the fluid cooled server 610 may include at least a front opening 622 in the enclosure of the fluid cooled server 610. In some cases, the fluid cooled server 610 may include one or more other openings, such as the side openings 624 and 626. In some cases, the front opening 622 and/or the side openings 624 and 626 may comprise a single opening or a series of smaller openings along at least a portion of the enclosure of the fluid cooled server 610. As discussed above, a component 630 (e.g., a processor, etc.) of the fluid cooled server 610 may be physically connected to a water block 640 through which a coolant fluid (e.g., water, coolant, etc.) may be pumped by the pump 650. The pump may also pump the heated coolant from the water block 640 to the radiator 670 to be cooled by the cooler airflow flowing into the enclosure, even after at least a portion of the cooler airflow is heated while passing by one or more heat generating components of the computer server 610. In some cases, the airflow is generated by one or more fans of the fan module 660.

Figure 7:
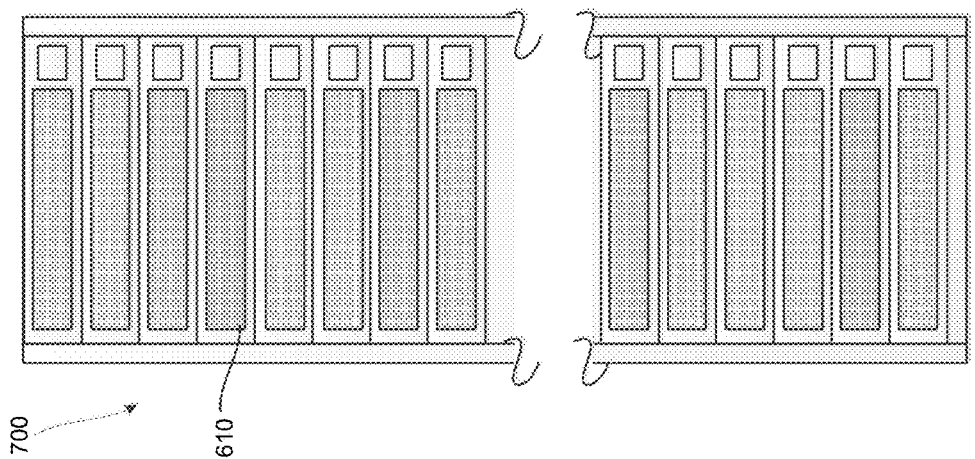
FIG. 7 shows an illustrative server rack according to one or more aspects of the disclosure.
Figure 9:
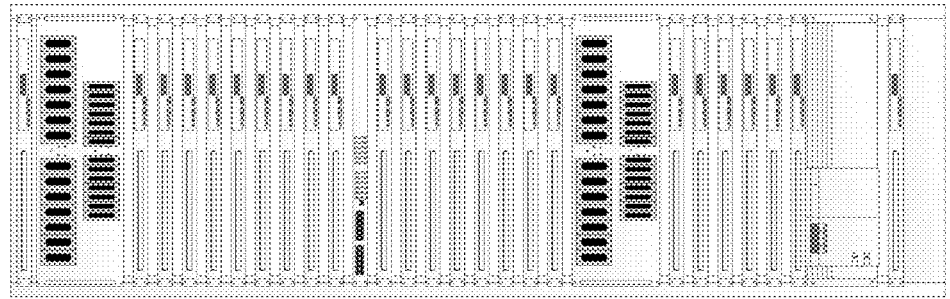
FIG. 9 shows an illustrative server rack according to one or more aspects of the disclosure.
Figure 8:
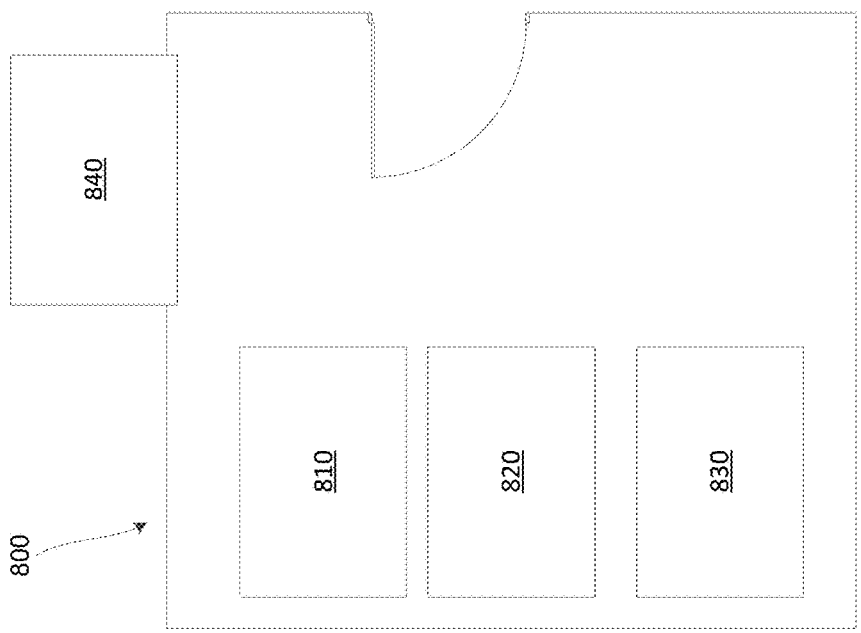
FIG. 8 shows an illustrative installation of computing equipment within a server room according to aspects of the disclosure.

FIG. 7 shows an illustrative server rack 700 according to one or more aspects of the disclosure. In some cases, the server rack 700 may include a plurality of servers having a size format, such as a 1U format server, a 2U format server, or a number of servers having a combination of different server size formats. In some cases, the servers including the server 610 may be positioned adjacent to one or more other servers, where each server is generating heat. FIG. 8 shows an illustrative installation of computing equipment within a server room 800 according to aspects of the disclosure. In some cases, the server room 800 may include one or more server racks 810, 820, 830, an illustration of one such server rack 810 is shown in greater detail in FIG. 9. The server rack 810 may include one or more servers, one or more routers, one or more memory devices (e.g., a RAID device, etc.), and the like. In some cases, each device in the server racks 810, 820, 830, or at least a number of devices, may generate heat which may be dissipated within the server room 800, such as by using a cooling device 840 (e.g., an HVAC device, a portable air conditioning unit, a heat pump, and/or the like).

Aspects of the disclosure have been described in terms of illustrative embodiments thereof. Numerous other embodiments, modifications, and variations within the scope and spirit of the appended claims will occur to persons of ordinary skill in the art from a review of this disclosure. For example, one of ordinary skill in the art will appreciate that the steps illustrated in the illustrative figures may be performed in other than the recited order, and that one or more steps illustrated may be optional in accordance with aspects of the disclosure.

What is claimed is:

1. A radiator for a computer server comprising:
   an inlet;
   four or more fluid channels, wherein each of the four or more fluid channels are fluidly connected in series to provide progressive cooling of fluid flowing within the four or more fluid channels;
   an outlet physically adjacent to the inlet; and
   a first end tank and a second end tank, wherein the first end tank and the second end tank are at opposite ends of the radiator;
   a first surface facing an interior of a server enclosure, the first surface including a mounting flange to receive a fan module, wherein the inlet and the outlet are located on the first surface of the first end tank adjacent to the mounting flange and wherein an airflow is drawn from the interior of the server enclosure through the fan modules to enter the radiator via the first surface and exits the server enclosure via a second surface opposite the first surface; and
   wherein the radiator has a height of less than 44 mm.

2. The radiator of claim 1, wherein the radiator is secured within a 1U chassis.

3. The radiator of claim 1, wherein the radiator provides at least 350 W heat exchange capacity.

4. The radiator of claim 1, wherein the radiator provides 350 W to 500 W heat exchange capacity.

5. The radiator of claim 1, further comprising the fan module.

6. The radiator of claim 5, wherein the fan module includes up to nine fans.

7. The radiator of claim 5, wherein the fan module includes reinforced fans.

8. The radiator of claim 7, wherein the reinforced fan comprises one or more reinforced fan blades.

9. The radiator of claim 5, wherein the fan module includes high power fans.

10. The radiator of claim 5, wherein the fan module moves air through a front of a computer server at an airflow rate of at least 200 CFM.

11. A cooling system for a computer server comprising:
    a radiator comprising:
       four or more fluid channels configured for progressive cooling of a coolant flowing through the fluid channels;
       a first end tank and a second end tank at opposite ends of the four or more fluid channels, wherein the first end tank includes an inlet and an outlet on a first surface of the first end tank: and
       the first surface facing an interior of a server enclosure, the first surface including a mounting flange to receive a fan module, wherein the inlet and an outlet are fluidly coupled to the fluid channels and are located adjacent to the mounting flange and wherein the radiator has
    a height of less than 44 mm;
    the fan module;
    a pump; and
    a water block.

12. The cooling system of claim 11, wherein the radiator has six fluid channels.

13. The cooling system of claim 11, wherein the fan module includes reinforced fans.

14. The cooling system of claim 11, wherein the water block is a low profile water block.

15. The cooling system of claim 11, wherein the water block is a copper water block.

16. The cooling system of claim 11, wherein the water block has a height of less than 23 mm.

17. The cooling system of claim 11, wherein the water block is attached to a central processing unit.

18. The cooling system of claim 11, wherein the cooling system provides the computer server with an average core temperature of 60° C. to 70° C.

19. The cooling system of claim 11, wherein the cooling system provides airflow through the computer server of at least 140 CFM.

20. The cooling system of claim 11, wherein the cooling system expels air from the computer server at an air velocity of at least 4 m/sec.

21. A computer server comprising:
    a radiator attached to a fan module, wherein the radiator and fan module are positioned adjacent an exterior edge of a computer server chassis wherein the radiator includes a first surface facing an interior of a server enclosure and a second surface adjacent the exterior edge of the computer server chassis, the first surface including a mounting flange to receive the fan module, and a first end tank and a second end tank, wherein the first end tank and the second end tank are at opposite ends of the radiator, and wherein the first end tank includes an inlet and an outlet on the first surface of the first end tank and located adjacent to the mounting flange and wherein the radiator has a height of less than 44 mm;
    a pump in fluid connection to the radiator, wherein the pump is positioned at a central area of the computer server chassis;
    a water block in fluid connection with the pump and the radiator, wherein the water block is physically adjacent to a central processing unit in an interior portion of the computer server chassis;
    wherein the pump pumps fluid between the water block and the radiator, wherein the fluid is progressively cooled by airflow generated by the fan module as the fluid passes through at least four successive fluid channels within the radiator.

* * * * *